US008545986B2

(12) United States Patent
Pater

(10) Patent No.: US 8,545,986 B2

(45) Date of Patent: Oct. 1, 2013

(54) COMPOSITE INSULATED CONDUCTOR

(75) Inventor: Ruth H. Pater, Yorktown, VA (US)

(73) Assignee: United States of America as represented by the Administrator of the National Aeronautics and Spacing Administration, Washington, DC (US)

( * ) Notice: Subject to any disclaimer, the term of this patent is extended or adjusted under 35 U.S.C. 154(b) by 843 days.

(21) Appl. No.: 12/043,276

(22) Filed: Mar. 6, 2008

(65) Prior Publication Data

US 2009/0011250 A1 Jan. 8, 2009

(51) Int. Cl.

| | |
|---|---|
| ***B32B 17/10*** | (2006.01) |
| ***B32B 15/08*** | (2006.01) |
| ***H01B 17/32*** | (2006.01) |
| ***H05K 9/00*** | (2006.01) |

(52) U.S. Cl.

USPC ........... 428/435; 428/473; 428/447; 428/458; 174/209; 174/386

(58) Field of Classification Search

USPC .................. 528/170; 428/435, 473, 447, 458

See application file for complete search history.

(56) References Cited

U.S. PATENT DOCUMENTS

| | | | |
|---|---|---|---|
| 3,745,149 | A | 7/1973 | Serafini et al. |
| 4,389,504 | A | 6/1983 | St. Clair et al. |
| 4,497,935 | A | 2/1985 | St. Clair et al. |
| 4,595,548 | A | 6/1986 | St. Clair et al. |
| 5,147,966 | A | 9/1992 | St. Clair et al. |
| 5,171,822 | A | 12/1992 | Pater |
| 5,412,066 | A | 5/1995 | Hergenrother et al. |
| 5,561,185 | A | 10/1996 | Hashimoto et al. |
| 5,644,022 | A | 7/1997 | Jensen |
| 5,648,432 | A | 7/1997 | Pater et al. |
| 5,741,883 | A | 4/1998 | Bryant |
| 5,770,676 | A | 6/1998 | Pater et al. |
| 5,866,676 | A | 2/1999 | Jensen |
| 6,162,548 | A | 12/2000 | Castellani et al. |
| 6,255,594 | B1 | 7/2001 | Hudson |
| 6,261,481 | B1 | 7/2001 | Akatusuka et al. |
| 6,339,189 | B1 | 1/2002 | Caimi |
| 6,359,107 | B1 | 3/2002 | Connell et al. |
| 6,777,525 | B2 | 8/2004 | Pater |
| 6,803,517 | B2 | 10/2004 | Caimi |
| 6,828,022 | B2 | 12/2004 | Bisleri et al. |
| 6,849,217 | B1 | 2/2005 | Peruzzotti et al. |
| 7,015,398 | B2 | 3/2006 | Vexler et al. |
| 2002/0108772 | A1 | 8/2002 | Hase et al. |
| 2002/0117325 | A1 | 8/2002 | Mennone et al. |
| 2003/0073803 | A1 * | 4/2003 | Pater ............................ 528/170 |

(Continued)

OTHER PUBLICATIONS

Ruth H. Pater et al., "Insulated Bus Pipe (IBP) for Shipboard Application," Paper No. ESTS-2007-PH, IEEE.

(Continued)

*Primary Examiner* — Jennifer Chriss

*Assistant Examiner* — Ricardo E Lopez

(74) *Attorney, Agent, or Firm* — Jennifer L. Riley; Robin W. Edwards

(57) ABSTRACT

A composite conductor includes a conductor that has a high temperature polyimide insulation formed around it. This polyimide layer may include reinforcing fibers such as, for instance, glass fibers. The insulation layer may further include grading layers. The conductor is placed inside an earth layer. The composite conductor may be protected with a stainless steel enclosure.

21 Claims, 1 Drawing Sheet

(56) References Cited

U.S. PATENT DOCUMENTS

| | | | |
|---|---|---|---|
| 2004/0147657 | A1 | 7/2004 | Hase et al. |
| 2004/0149482 | A1 | 8/2004 | Watanabe et al. |
| 2005/0023029 | A1 | 2/2005 | Mammeri et al. |
| 2005/0137383 | A1 * | 6/2005 | Connell et al. ................ 528/353 |
| 2005/0205290 | A1 | 9/2005 | Pinacci et al. |
| 2005/0209429 | A1 * | 9/2005 | Dingemans et al. ............ 528/59 |
| 2006/0019102 | A1 * | 1/2006 | Kanakarajan .............. 428/423.1 |
| 2007/0039752 | A1 | 2/2007 | Tenyakov |

OTHER PUBLICATIONS

Richard Worth et al., “Insulated Bus Pipe (IBP) for Power Utility Applications,” ESMO 2006, ICCC 11th International Conference on Transmission & Distribution Construction, Operation and Live-Line Maintenance, 2006. Oct. 15-19, 2006.

Moni Islam et al., “Insulated Bus Pipe (IBP) for Shipboard Application,” Industry Applications Society 53rd Annual Petroleum and Chemical Industry Conference, 2006. Sep. 11-Oct. 15, 2006, pp. 1-6.

* cited by examiner

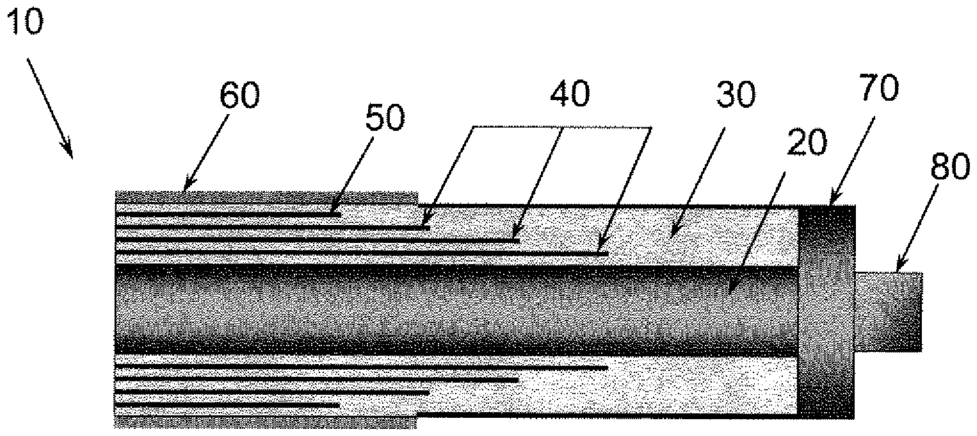
10
60
50
40
30
70
20
80

COMPOSITE INSULATED CONDUCTOR

This invention was made by an employee of the United States Government and may be manufactured and used by or for the Government of the United States of America for a governmental purposes without the payment of any royalties thereon or therefore.

ORIGIN OF THE INVENTION

Pursuant to 35 U.S.C. §119, the benefit of priority from provisional applications 60/894,484 and 60/895,789, with filing dates of Mar. 13, 2007 and Mar. 20, 2007, respectively, is claimed for this non-provisional application.

BACKGROUND OF THE INVENTION

1. Field of the Invention

The present invention is directed to a composite conductor product having improved insulation, fire, high temperature, dielectric, chemical and moisture resistance and halogen-free attributes.

2. Description of the Related Art

Many different types of insulation materials are known for use in connection with conductor products generally. Consumer applications are typically low voltage/amp wires and cables. Many polymers may be used to meet the insulation and flexibility specifications of these types of products. However, some applications have more demanding electrical and environmental performance specifications. Conductors in the form of wires, cables, bus bars, and bus pipes can carry high voltages and currents. There is a need for a better and more robust insulation layer around these conductors.

In addition to high voltage and amp requirements generally, some installations of conductors require harsh environmental performance specifications. For instance, the commercial and military shipbuilding industries are exploring “all electric ship” power system designs. These systems have high survivability demands. Other major challenges to applications like these include tight installation constraints and weight limitations. An overview of insulated bus pipe technology is provided in Insulated Bus pipe (IBP) for Shipboard Applications, R. Worth, M. Islam, R. Pater, and C. Smith, IEEE Electric Ship Technologies Symposium, 21-23 May 2007, p. 122-129, incorporated herein by reference in its entirety. Therefore, there is a need for conductors that can meet high survivability requirements and are able to efficiently carry a high current and voltage but still remain reasonably insulated in tight areas.

SUMMARY OF THE INVENTION

Accordingly, it is an object of the present invention to provide a composite insulated conductor that is engineered to carry high voltage and amp electrical current yet still remain reasonably and safely insulated. The conductor includes a high temperature polyimide resin insulation layer formed around the conductor. The polyimide resin may be reinforced with glass fiber or fabric. Integral in this polyimide resin system are grading materials that form safety layers around the conductor to reduce or prevent any failures of insulation of the composite conductor. Additionally, an earth layer is formed around the polyimide resin to form a grounding layer. For protection against an external force and water penetration in the event of water submersion, a stainless steel pipe may be used to cover the composite insulated conductor. These composite components may be used alone or in combination with each other to achieve desirable properties for an insulated conductor in a given application.

BRIEF DESCRIPTION OF THE DRAWINGS

FIG. 1 is a side cross sectional view of an electrical conductor in accordance with an embodiment of the invention described herein.

DETAILED DESCRIPTION OF THE INVENTION

In its most basic form, the invention described herein is an electrical conductor having a high temperature polyimide resin formed in an insulating layer around it. This insulation layer may include reinforcing fibers or fabrics including, for example, glass fibers. This insulation layer may further include one or more grading layers to more efficiently insulate the conductor. Additionally, the composite conductor may be surrounded by an earth layer that serves as a grounding material to dissipate any electric field that may emit from the conductor core. Finally, to protect against an external force and water penetration in the event of water submersion, a stainless steel pipe may enclose the center portion of the composite insulated conductor where it is embedded with earth layer. Each of the foregoing components of a composite conductor may be incorporated into a single product. Alternatively, only two or more of the components may be incorporated depending on the electrical requirements of the particular conductor product application.

FIG. 1 is a simple schematic, cross sectional side view of a composite conductor 10 that incorporates each of the foregoing components. A conductor 20 is shown inside the high temperature polyimide resin insulation layer 30. This insulation layer 30 includes both a high temperature polyimide and reinforcing glass fibers. Three grading layers 40 are shown. These are embedded in the insulating layer 30 and are coaxially wrapped around the conductor 20. An earth layer 50 is wrapped coaxially around the conductor construction to form the grounding mechanism to dissipate any electricity that may accidentally escape the conductor 20. A stainless steel pipe 60 covers most of the entire composite insulated conductor, where the earth layer is embedded to protect against damage by an external force and/or to prevent water penetration in the event of water submersion or flooding. The pipe 60 does not extend all the way to the end ring 70; it stops a short distance (few inches) from it. The flat terminal 80 is the electrical connection component at the end of the conductor 20.

Each of the components identified above shall now be discussed in more detail.

Conductor

Any conductor may be used in connection with the composite construction of the present invention. The conductor may be a wire, cable, rod, bus bar, or bus pipe, and may be any conductive material. Typically, the conductor will be fabricated from copper or aluminum. However, other conductive materials, metal or otherwise, may be used.

At least some of the applications described herein include high current and voltage applications. These may include bus bars and bus pipes that transmit one hundred or more kilovolts per section. The conductor described herein may carry in excess of about 500 KV. In another example, the conductor may carry in excess of about 250 KV.

Polyimide Chemical Structures

The high temperature polyimide resin of the present invention may be a thermosetting polyimide having a crosslinking end group. A thermosetting polyimide may be prepared by a conventional condensation process in which monomer reactants are dissolved in a high boiling solvent, for example, N-methylpyrrolidinone (NMP), to give a polyamic acid solution. The polyamic acid is then cured at an elevated temperature. Alternatively, a thermosetting polyimide may be prepared from in-situ polymerization of monomer reactants (PMR) in a low boiling alcoholic solvent, for example, methanol, to give a salt complex of the monomer reactants. The salt complex of the monomer reactants is then cured at an elevated temperature. A polyimide prepared by the PMR process described above is referred to as a PMR type polyimide. The PMR process for making a polyimide matrix composite is especially effective because of the use of a low boiling solvent and the formation of a low molecular weight salt complex of monomer reactants.

An alcoholic solvent (e.g. methanol, boiling point 64° C.) is easier to remove than an aprotic solvent (e.g. NMP, boiling point 202° C.). Additionally, the salt complex of the monomer reactants formed in the PMR process generally has lower melt viscosity compared to the polyamic acid formed in the condensation process. These attributes make a polyimide matrix composite easier to process by the PMR process than by the conventional condensation process. Using the PMR process, the monomer solution is impregnated into a reinforcing fiber, and in situ polymerization of the monomer reactants occurs directly on the fiber surface to afford a composite material having good thermal and mechanical performance. The PMR type polyimides of the present invention are prepared from (a) a crosslinking end group, (b) a dialkyl or higher alkyl ester of an aromatic tetracarboxylic acid which is prepared from refluxing an aromatic dianhydride in an alcoholic solvent, and (3) an aromatic diamine. The crosslinking end group may be selected from the following monomers:

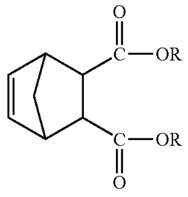

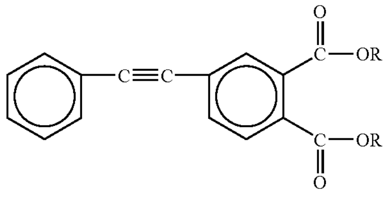

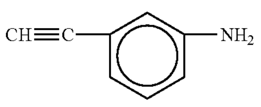

wherein R is:

H, $CH_3$, $CH_3CH_2$, $CH_3CH_2CH_2$, or 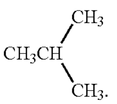

The dialkyl or higher alkyl ester of an aromatic tetracarboxylic acid is derived from refluxing in an alcoholic solvent one of the following aromatic dianhydrides:

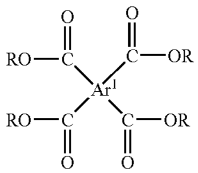 is an ester derivative of one of the following aromatic dianhydrides:

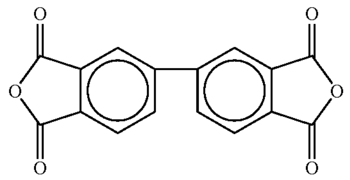

3,3′,4,4′-Biphenyltetracarboxylic dianhydride (BPDA)

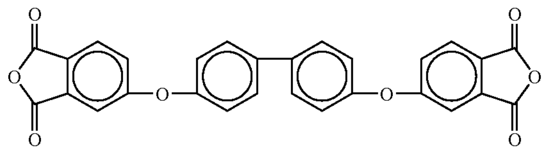

4,4′-Biphenoxydiphthalic anhydride (BPODA)

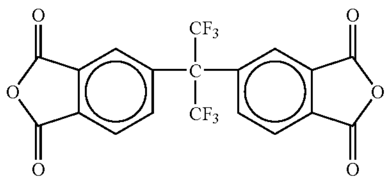

2,2-Bis(3,4-dicarboxyphenyl)hexafluoropropane dianhydride (6FDA)

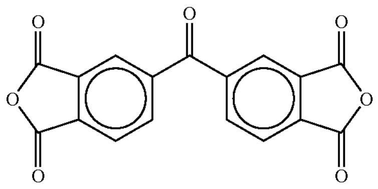

3,3′,4,4′-Benzophenonetetracarboxylic dianhydride (BTDA)

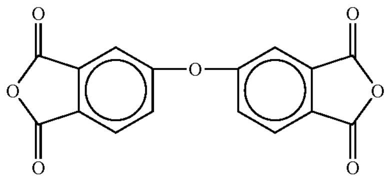

4,4′-Oxydiphthalic anhydride (ODPA)

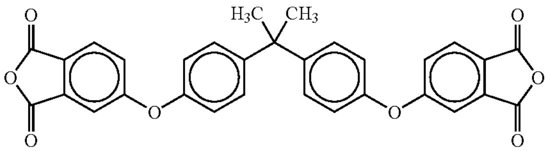

Bisphenol A dianhydride (BPADA)

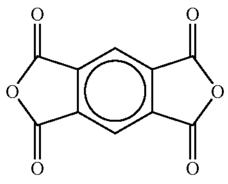

Pyromellitic dianhydride (PMDA)

wherein R is:

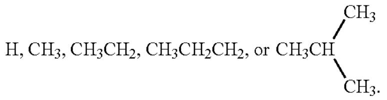

The aromatic diamine is selected from the following: $H_2N$—Ar—$NH_2$ is one of the following:

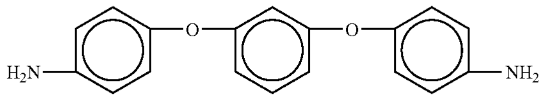

1,3-Bis(4-aminophenoxy)benzene (1,3,4-APB)

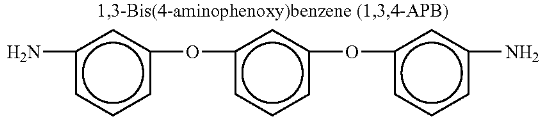

1,3-Bis(3-aminophenoxy)benzene (1,3-APB)

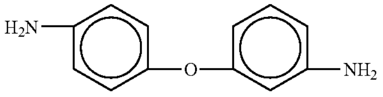

3,4′-Diaminodiphenyl ether (3,4′-ODA)

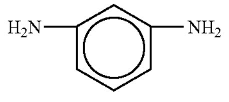

1,3-Diaminobenzene (DAB)

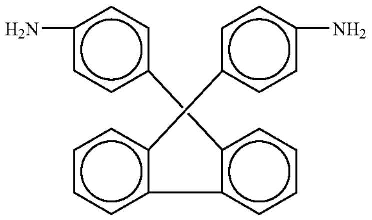

9,9′-Bis(4-aminophenyl)fluorene (FDA)

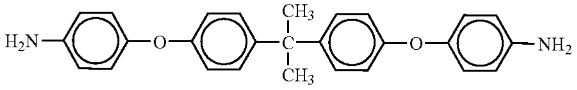

2,2-Bis(4-[4-aminophenoxyl]phenyl)propane (BAPP)

Depending on the crosslinking end group selected, the polyimides of the present invention may be prepared according to the following general reactions:

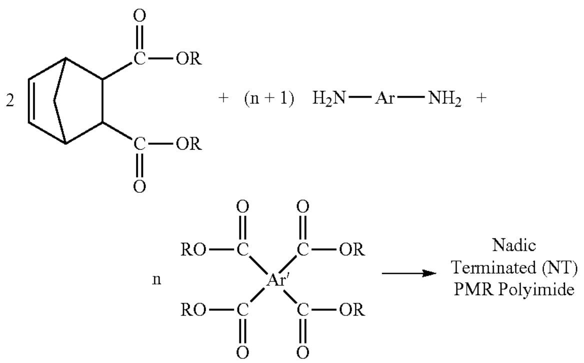

-continued

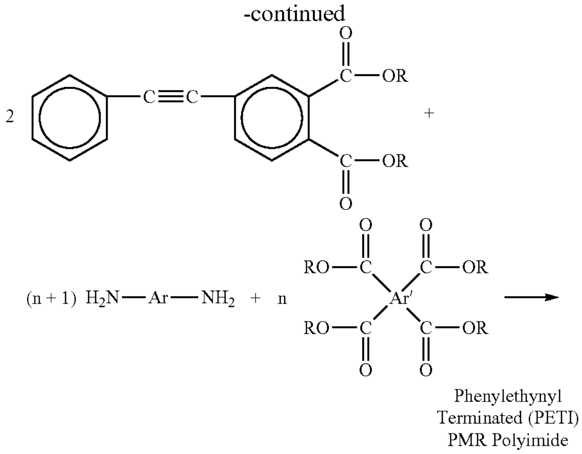

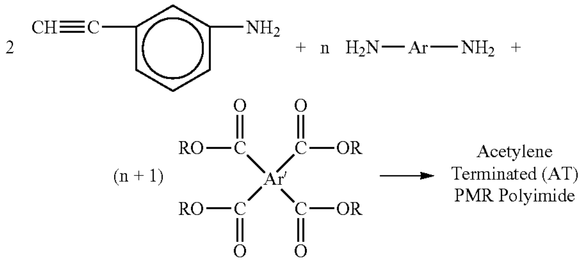

wherein R is:

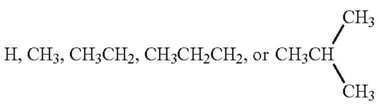

and wherein n has a value of 1 to 50. To achieve a favorable balance of high temperature performance and easy processability, it is desirable to have the value of n be 1 to 3.

The polyimides prepared from the below reactions have easy processing and excellent thermal and mechanical properties:

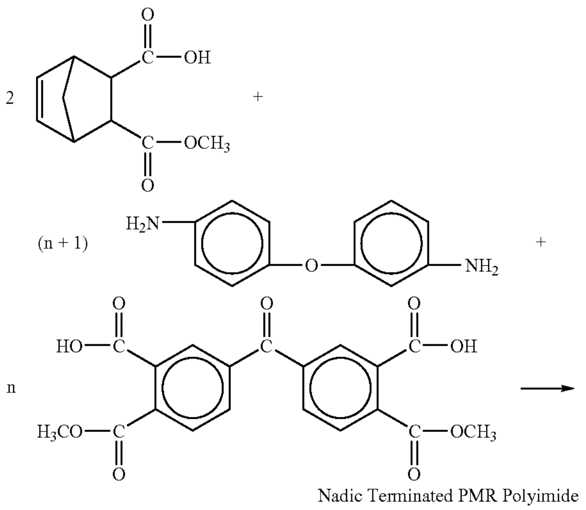

wherein n=1 to 3

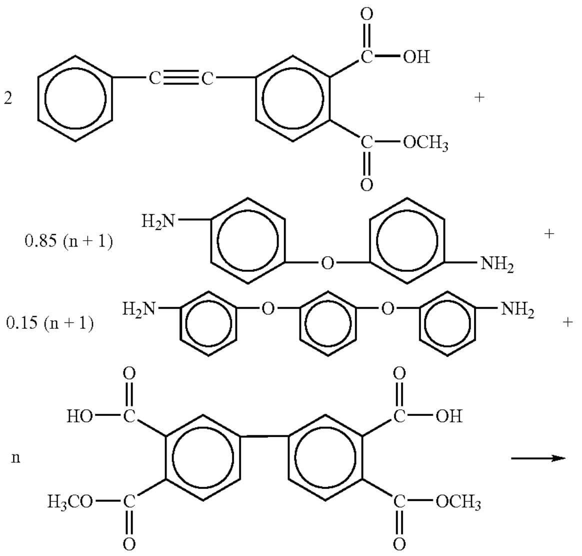

PETI PMR Polyimide wherein n=1 to 3

The high temperature performance of the present conductor may range from about 200° C. to about 200° C. Therefore, the polymide must be stable up to very high temperatures without decomposing or melting.

It is also desirable for the polymide to meet other performance requirements, including high dielectric and moisture resistance properties. In one example, the dielectric constant at 1 mHz is in the range of 2.0 to 8.0 and dissipation factor in the range of 0.0001 to 0.05. In another example, moisture absorption is in the range of 0.01 to 6.0%.

The polymide should also have excellent chemical and corrosion resistance against acids, organic solvents, alcohols, cleaning solutions, jet fuels, greases and oils, halogenated hydrocarbons, halogens, ketones and alkaline solvents. The polyimide should not produce toxic out gases when burned. In addition, the polyimide should be halogen free.

Fiber Reinforcement

The polyimide insulation layer may include reinforcement. These reinforcements may typically be glass (such as fiberglass or quartz) or Kevlar® fibers, woven fabric, stocking, sleeves, tape, chopped fiber, filler, and/or combinations thereof. The reinforcement may be impregnated with the polyimide resin to produce a prepreg, which is subsequently wrapped around the conductor and then cured. The prepreg may be made by coating the glass reinforcement with a polyimide resin solution at room temperature or with a polyimide melt at an elevated temperature. Alternatively, the reinforcement may be first wrapped around the conductor followed by impregnation with the polyimide resin and then cured. The impregnation of the polyimide resin into the reinforcement wrapped around the conductor may be achieved by infiltrating a polyimide resin solution at room temperature or a polyimide melt at an elevated temperature under vacuum. In addition, the impregnation of the polyimide resin may also be accomplished by applying a polyimide resin solution at room temperature or a polyimide melt at an elevated temperature to the glass reinforcement wrapped around the conductor at an atmospheric pressure or under pressure.

Processes for Making the Composite Insulated Conductor

The composite insulated conductor may be processed by an autoclave, vacuum assisted resin transfer molding (VARTM), resin transfer molding (RTM), compression molding, filament winding, or simple oven curing at an atmospheric pressure and in air.

Grading Layer

The conductor composite may optionally include one or more grading layers in order to dissipate any leakage of electrical current from the conductor. These layers may be coaxially mounted in the insulation layer and around the central conductor. These grading layers may be formed from copper foil, aluminum foil, copper mesh, copper braided stocking, bare copper wire or cable, graphite fibers or fabrics, chopped graphite fibers or carbon powder, conductive films, and/or combinations thereof. The thickness of the foil or gauge of the mesh or stocking will depend on the specific demands of the conductor application.

Earth Layer

The composite conductor may be enclosed in an earth layer that is wrapped around the polyimide insulation material. The earth layer forms a grounding component to reduce/eliminate the electric field that may be created around the conductor. It also provides touch safety during operation. The earth layer may be fabricated from copper foil, copper mesh, or copper braided stocking among other conductive materials.

EXAMPLES

An insulated bus bar was formed in accordance with the foregoing teachings.

Example 1

Preparation of LARC™ RP 46 Composite Insulated Bus Bar

1(a) Copper conductor: The copper conductor was supplied by PEP Preissinger GmbH Co. KG. It was 9.84 ft. long with an end ring and flat terminal at both ends of the conductor. Between the end rings, the conductor had a 1.57 in. diameter and was 107.78 in. long.

1(b) Aluminum conductor: The aluminum conductor was purchased from the same company as described above in 1(a) for the copper conductor. It had the same length but a larger diameter (1.974 in.) between the end rings as compared to those of the copper conductor.

2) Polyimide resin: —LARC™ LaRC RP 46 polyimide resin solution was prepared by mixing 4672 g of dimethyl ester of 3,3',4,4'-benzophenonetetracarboxylic acid (BTDE) solution in methanol having 74.32% by weight solid content with 2671 g of 3,4'- oxydianiline (3,4'- ODA) and 3500 g of methanol. The BTDE solution was prepared by refluxing 3,3'4,4'-benzophenonetetracarboxylic dianhydride (BTDA) in methanol for 1 hour. The mixture was stirred at room temperature under nitrogen gas for 16 hours and 1700 g of monomethyl ester of 5-norbomene-2,3-dicarboxylic acid (NE) was then added 1700 g of NE. The reaction mixture was further stirred at room temperature for an additional 3 hours to give a LARC™ LaRC RP 46 resin solution which had 62% solid content. LARC™ RP 46 is described in U.S. Pat. No. 5,171,822, incorporated herein by reference in its entirety.

3) Glass Reinforcements: S-2 glass fabric style 17645 was purchased from JPS Composite Materials. Glass fabric stockings having 0.016 in. thickness were supplied by Soller Composites, LLC. The stockings had diameters of 2.5, 3.0 and 4.0 in. Additionally, 2 in. wide glass fabric tape was also used as a reinforcement.

4) Grading Material: Bare copper mesh had 16 mesh per in. and 0.011 in. wire diameter and was purchased from TWP Inc.

5) Earth Layer materials: Bare copper wire and copper foil with 0.002 in. thickness.

6) Stainless steel pipe: 5.73 ft. long with an inside diameter of 3.26 in. and an outside diameter of 3.322 in. and a thickness of 0.062 in.

7) Description of the polyimide composite insulated copper bus pipe assembly:

The copper conductor was cleaned with acetone and methanol. After air dry, the cleaned surface was primed with a polyimide resin solution prepared by mixing the nadic end-capped silane coupling agent, 3-(5-norborneneimidoyl) propyltrimethoxysilane (1% by weight) with LARC™ RP 50 resin solution (7% by weight) in NMP solvent (U.S. Pat. No. 6,777,525 B2, incorporated by reference herein in its entirety). The primed copper was wrapped with four (4) layers of S-2 glass fabric. The LARC™ RP 46 polyimide resin solution prepared as described above was brushed unto the glass cloth. The amount of the resin solution used was calculated to give prepreg with 40% by weight resin content. The glass cloth appeared to be well saturated with the resin. The first grading layer was made by wrapping the copper mesh tightly around the glass cloth. The copper mesh was 7.5 in. from each of the end rings. The copper mesh was again wrapped tightly with glass tape. Next, four layers of the glass stocking were added and saturated with the polyimide resin solution. The copper mesh was wrapped around the wet glass stocking followed by tightening the copper mesh with the glass tape. The second grading layer had the copper mesh 13 in. away from each of the end rings. The same process was repeated, except that the distance between the copper mesh and end ring was 18 in. for the third grading layer. Again, four layers of the glass stocking were added and saturated with the polyimide resin solution. The assembly was cured in an autoclave at 625° F. under 200 psi pressure for 2 hours. The earth layer was made by winding the copper wire around the cured assembly. The copper wire had a 21 in. distance away from the end rings. This was followed by wrapping the copper wire with the copper foil. Additional layers of the glass stocking were wrapped around the copper foil to fill the space between the stainless steel enclosure and the earth layer described above. The layers of the glass cloth were impregnated with the polyimide resin solution. The assembly was enclosed with the stainless steel pipe. To seal the stainless steel pipe, both ends of the pipe were tightly wrapped with three layers of the glass stocking followed by impregnation with the polyimide resin. Finally, the entire assembly was placed in an autoclave and cured using the same cure cycle described earlier. The thickness of the insulation including the earth and grading layers was 0.94 in.

Example 2

Two additional polyimide reinforced glass fabric composite insulated copper conductor assemblies were fabricated in the same process as described in Example 1, except that the additional assemblies did not have a stainless steel enclosure.

Example 3

Two polyimide/fiber glass composite insulated aluminum bus bars were made in the same fashion as described in Example 2.

Example 4

A solid copper rod 72.25 in. long and 1.63 in. diameter was wrapped with 12 layers of glass fabric stocking which were impregnated with the same polyimide resin and cured using the same cure cycle as described in Example 1. The thickness of the insulation around the conductor was 0.18 in. Unlike Example 1, this composite insulated copper conductor contained neither grading nor earth layers, and no stainless steel pipe.

Example 5

Like Example 4, another solid copper rod 72.25 in. long and 2.26 in. in diameter was wrapped with 18 layers of glass fabric stocking, impregnated with the polyimide resin, and cured as described in Example 1. The thickness of the insulation was 0.30 in. Like Example 4, this insulation system contained no grading, earth layers, or stainless steel enclosure.

Example 6

Six copper pipes 16 in. long, each having a diameter of 1.63 in. and a thickness of 0.057 in. were each wrapped with 12 layers of glass fabric stocking which were impregnated with the same polyimide resin and cured as described in Example 1. The thickness of the insulation for each was 0.14 in.

Example 7

In the same manner as Example 6, a polyimide/glass composite insulated aluminum conductor was prepared. The aluminum conductor was 18 in. long, 2.002 in. in diameter, and 0.100 in. thick. The thickness of the insulation layer was 0.045 in.

Example 8

The insulated copper pipe of Example 6 was tested for its ability to withstand a 3 hour gas flame test. Despite being subjected to a gas flame temperature of between 1550° F. to 1650° F. for 3.5 hours, no fire and no fuse failure were observed, and electrical circuit and insulation structural integrities were maintained throughout the entire test.

Example 9

The aluminum conductor described in Example 7 was subjected to a gas flame temperature between 1650° F. to 1750° F. for 3.5 hours. As with the copper conductor, no fire or fuse failure were observed. Both electrical circuit and insulation structural integrities were maintained throughout the 3.5 hour gas flame test.

Example 10

United States Navy 3 Hour Gas Flame Circuit Integrity Test

The insulated bus pipe of the Example 1 described above was subjected to the Navy 3 Hour Gas Flame Circuit Integrity Test according to the NSWCCD-9431 APODS, Section 2.6, test 6 specifications. The test was performed at a Navy certified testing facility. The purpose of the test was to determine the ability of the insulation system to maintain electrical circuit integrity of the conductor throughout a 3 hour gas flame. The test specimen weighing approximately 160 lbs was placed in a specimen holder. The test specimen was placed parallel to the burner, horizontally centered above the burner and 1⅞ in. above the ribbon burner. The test specimen was energized and the burner was then ignited. The gas ribbon burner was 24 in. long. The ribbon burner accepted gas and air from the gas and air supply. The gas and air were thoroughly blended before exiting for burning via a multiplicity of holes in the ribbon burner's top. When the gas flame reached a blue colored flame, indicating that a maximum flame temperature had reached, the timing device started. This process took about 30 minutes. Five thermocouples were placed above the burner and they were positioned very close to but not touching the surface of the test specimen to measure the temperatures of the gas flame in various locations. The temperatures recorded by the computer ranged from 2100° F. to 2300° F. during the 3 hour gas flame test. Despite being subjected to a gas flame temperature of between 2100° F. to 2300° F. in air for 3 hours, no fire, no smoke, no explosion, and no fuse failure were observed. Additionally, electrical circuit and insulated bus pipe structural integrities were maintained throughout the entire test. To determine how long the insulated materials and assembly could withstand the extreme high heat and maintain electrical circuit and structural integrities of the conductor, the tested insulated system was subject to the second 3 hour gas flame test at a temperature of 2150° F. to 2250° F. Like the first 3 hour gas flame test, no fire or fuse failure were observed, and electrical circuit and structural integrities were maintained throughout the entire 3 hour test. The insulated assembly was then subjected to the third and fourth 3 hour gas flame tests. The gas flame test temperatures for the third and fourth 3 hour gas flame tests were between 2000° F. to 2250° F. and between 2150° F. to 2250° F., respectively. No fire or fuse failure were observed, and electrical circuit and structural integrities were maintained throughout the entire 3 hour test for both of the third and fourth 3 hour gas flame tests.

The unexpected ability of the present insulated system to withstand over 2000° F. gas flame temperature for a minimum of 12 hours demonstrates the extraordinary fire resistant and electrical insulation characteristics of the present invention. No polymeric materials or insulated conductors have ever been known to withstand such an extreme temperature. Furthermore, this is in sharp contrast to the performance of an epoxy matrix composite insulated bus pipe tested earlier at the same Navy certified fire testing lab, which failed the Navy 3 hour Gas Flame Test because of the inability of the insulation materials to withstand the extreme temperature (the epoxy resin is rated at 248° F.). The numerous applications of the present invention include use in high temperature, high voltage, high rise buildings in heavily populated cities, like New York, Tokyo, Shanghai, and London, as well as use in ships.

Many modifications and other embodiments of the invention will come to mind to one skilled in the art to which this invention pertains having the benefit of the teachings presented in the foregoing descriptions and the associated drawing. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed as new and desired to be secured by Letters Patent of the United States is:

1. A composite insulated electrical conductor comprising:

a conductor;

a cured polyimide insulation layer formed around the conductor; and a plurality of integrally embedded layers infiltrated with the cured polyimide;

wherein the cured polyimide is integrally formed with the embedded layers from infiltration and in-situ polymerization of monomer reactants comprising:

(a) a crosslinking end group selected from the group consisting of the following monomers:

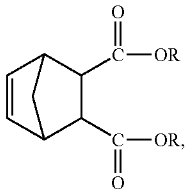

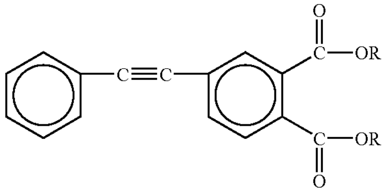

and

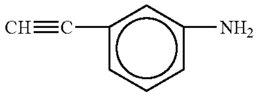

wherein R is:

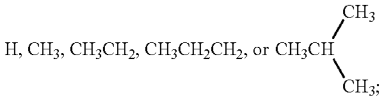

(b) an ester selected from the group consisting of dialkyl, trialkyl, and tetraalkyl having the general structure:

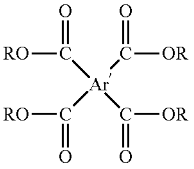

wherein R is:

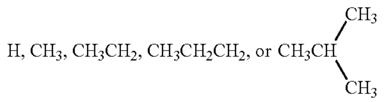

and wherein Ar' is a tetravalent aryl radical; and (c) an aromatic diamine;

and further wherein said integrally embedded layers comprise:

(i) a grading layer embedded inside the insulation layer; and (ii) an earth layer embedded inside the insulation layer and located around the grading layer; and even further wherein said composite conductor is characterized as maintaining its electrical circuit and structural integrity at a temperature of at least about 1600° F. for at least three (3) hours.

2. An insulated electrical conductor as in claim 1, wherein the polyimide is prepared according to the following general reaction:

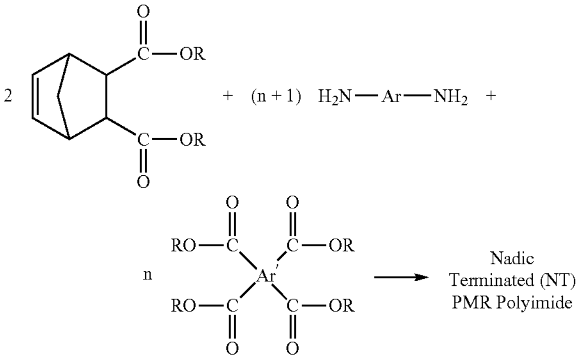

wherein the mole ratio of the monomer reactants is 2:(n+1):n, wherein n has a value from 1 to 50, and wherein $H_2N$—Ar—$NH_2$ is selected from the group consisting of:

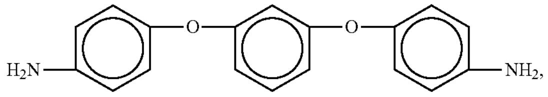

1,3-Bis(4-aminophenoxy)benzene (1,3,4-APB)

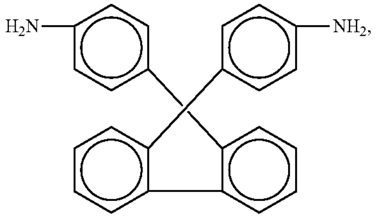

9,9′-Bis(4-aminophenyl)fluorene (FDA)

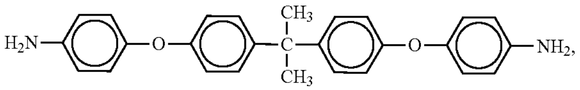

2,2-Bis(4-[4-aminophenoxyl]phenyl)propane (BAPP)

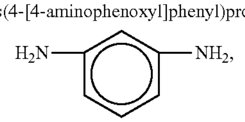

and 1,3-Diaminobenzene (DAB)

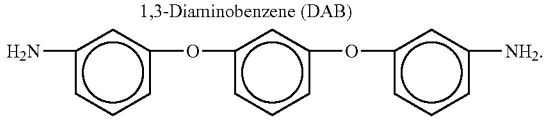

1,3-Bis(3-aminophenoxy)benzene (1,3-APB)

3. An insulated electrical conductor as in claim 1 wherein the polyimide is prepared according to the following general reaction:

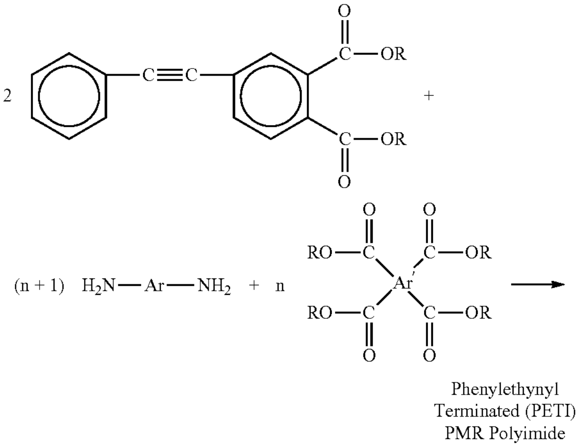

wherein the mole ratio of the monomer reactants is 2:(n+1):n, wherein n has a value from 1 to 50, and wherein $H_2N$—Ar—$NH_2$ is selected from the group consisting of:

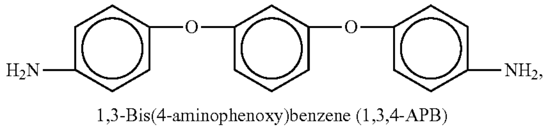

1,3-Bis(4-aminophenoxy)benzene (1,3,4-APB)

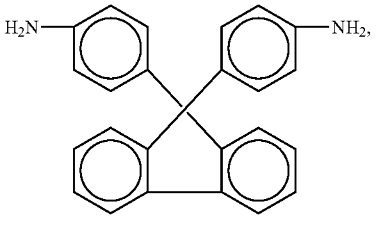

9,9′-Bis(4-aminophenyl)fluorene (FDA)

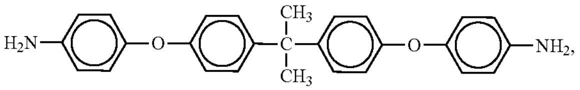

2,2-Bis(4-[4-aminophenoxyl]phenyl)propane (BAPP)

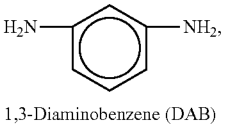

and 1,3-Diaminobenzene (DAB)

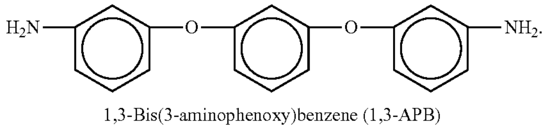

1,3-Bis(3-aminophenoxy)benzene (1,3-APB)

4. An insulated electrical conductor as in claim 1, wherein the polyimide is prepared according to the following general reaction:

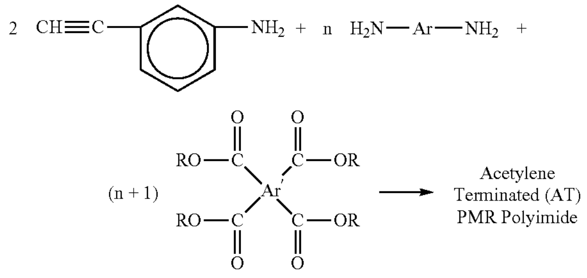

wherein the mole ratio of the monomer reactants is 2:(n+1), wherein n has a value from 1 to 50, and wherein $H_2N$—Ar—$NH_2$ selected from the group consisting of

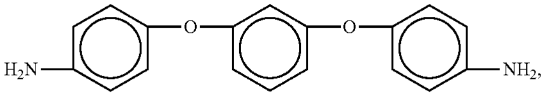

1,3-Bis(4-aminophenoxy)benzene (1,3,4-APB)

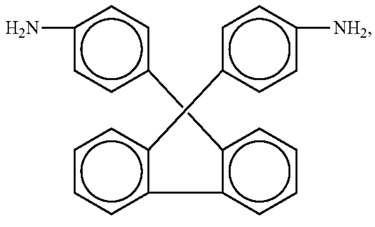

9,9′-Bis(4-aminophenyl)fluorene (FDA)

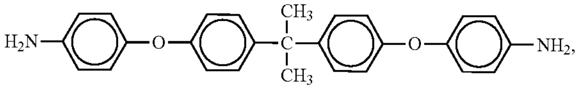

2,2-Bis(4-[4-aminophenoxyl]phenyl)propane (BAPP)

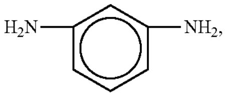

and 1,3-Diaminobenzene (DAB)

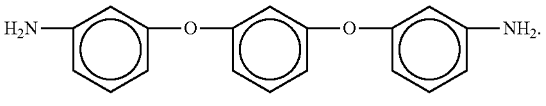

1,3-Bis(3-aminophenoxy)benzene (1,3-APB)

5. An insulated electrical conductor as in claim 1, wherein the ester is prepared from reacting an alcohol with an aromatic dianhydride selected from the group consisting of:

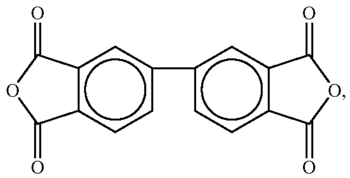

3,3′,4,4′-Biphenyltetracarboxylic dianhydride (BPDA)

-continued

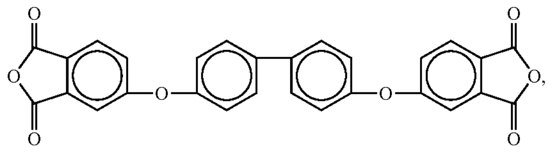

4,4′-Biphenoxydiphthalic anhydride (BPODA)

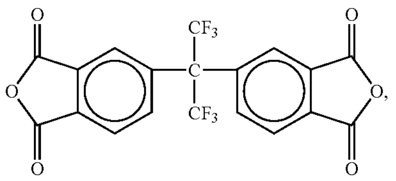

2,2-Bis(3,4-dicarboxyphenyl)hexafluoropropane dianhydride (6FDA)

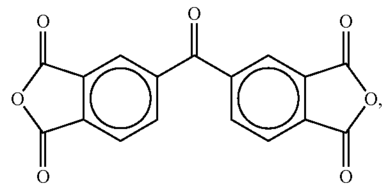

3,3′,4,4′-Benzophenonetetracarboxylic dianhydride (BTDA)

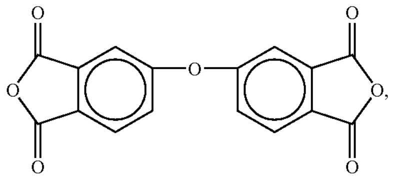

4,4′-Oxydiphthalic anhydride (ODPA)

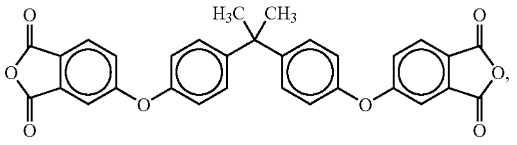

and

Bisphenol A dianhydride (BPADA)

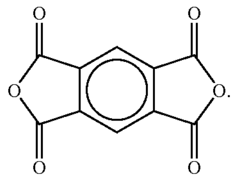

Pyromellitic dianhydride (PMDA)

6. An insulated electrical conductor as in claim 1, wherein the aromatic diamine has the general structure $H_2N$—Ar—$NH_2$ and is selected from the group consisting of:

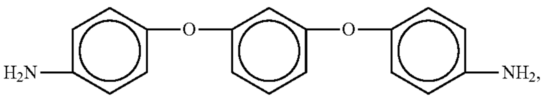

1,3-Bis(4-aminophenoxy)benzene (1,3,4-APB)

-continued

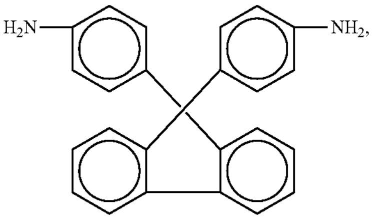

9,9'-Bis(4-aminophenyl)fluorene (FDA)

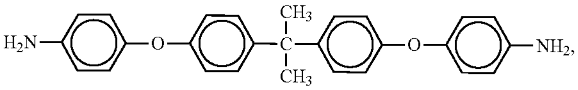

2,2-Bis(4-[4-aminophenoxyl]phenyl)propane (BAPP)

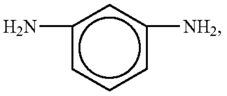

and 1,3-Diaminobenzene (DAB)

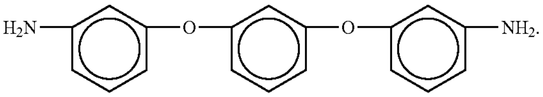

1,3-Bis(3-aminophenoxy)benzene (1,3-APB)

7. The insulated electrical conductor as in claim 2, wherein n has a value of 1 to 3.

8. The insulated electrical conductor as in claim 3, wherein n has a value of 1 to 3.

9. The insulated electrical conductor as in claim 4, wherein n has a value of 1 to 3.

10. An insulated electric conductor as in claim 1, wherein the conductor is primed with a nadic endcapped silane coupling agent for improving the adhesive bond of the polyimide to the conductor of claim 1.

11. An insulated electrical conductor as in claim 10, wherein the nadic endcapped silane coupling agent is:

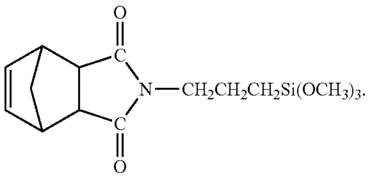

12. An insulated electrical conductor as in claim 1, wherein the conductor is selected from the group consisting of wire, cable, bus bar and bus pipe.

13. An insulated electrical conductor as in claim 1, wherein the polyimide insulation layer further comprises glass fibers.

14. An insulated electrical conductor as in claim 1, further comprising glass reinforcement selected from the group consisting of glass fiber, glass woven fabric, glass stocking, glass tape, chopped glass fiber, glass filler, and combinations thereof.

15. An insulated electrical conductor as in claim 1, wherein the grading layer is selected from the group consisting of copper foil, aluminum foil, copper mesh, and copper braided stocking.

16. An insulated electrical conductor as in claim 1, further comprising a plurality of grading layers embedded inside the insulation layer and located interior to the earth layer.

17. An insulated electrical conductor as in claim 1, wherein the earth layer is selected from the group consisting of copper foil, copper mesh, and copper braided stocking.

18. An insulated electrical conductor as in claim 1, wherein the conductor is adapted to carry at least 1 KV.

19. A composite insulated electrical conductor comprising:

a conductor;

a cured polyimide insulation layer formed around the conductor; and a plurality of integrally embedded layers infiltrated with the cured polyimide;

wherein the cured polyimide is integrally formed with the embedded layers from infiltration and in-situ polymerization of monomer reactants comprising:

(a) a crosslinking end group selected from the group consisting of the following monomers:

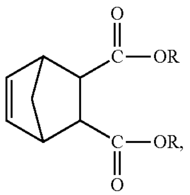

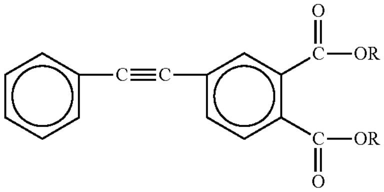

and

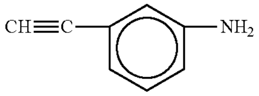

wherein R is:

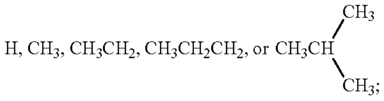

(b) an ester selected from the group consisting of dialkyl, trialkyl, and tetraalkyl having the general structure:

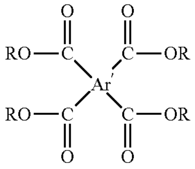

wherein R is:

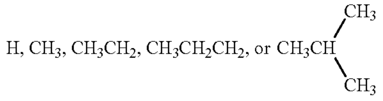

and wherein Ar' is a tetravalent aryl radical; and (c) an aromatic diamine;

and further wherein said integrally embedded layers comprise:

(i) a glass reinforcement layer comprising glass selected from the group consisting of glass fiber, glass woven fabric, glass stocking, glass tape, chopped glass fiber, glass filler, and combinations thereof; and (ii) a grading layer embedded inside the insulation layer;

and even further wherein said composite conductor is characterized as maintaining its electrical circuit and structural integrity at a temperature of at least about 1600° F. for at least three (3) hours.

20. An insulated electrical conductor as in claim 19, further comprising an earth layer embedded inside the insulation layer and located around the grading layer.

21. An insulated electrical conductor comprising:

a conductor;

a polyimide insulation layer formed around the conductor, wherein the polyimide is formed in-situ polymerization of monomer reactants comprising:

(a) a crosslinking end group selected from the group consisting of the following monomers:

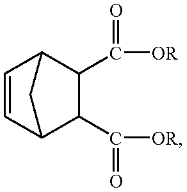

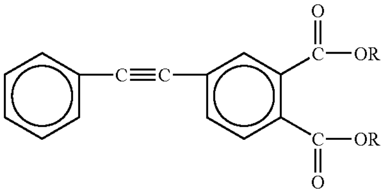 and

-continued

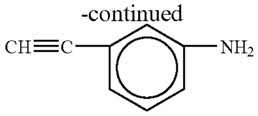

wherein R is:

H, $CH_3$, $CH_3CH_2$, $CH_3CH_2CH_2$, or 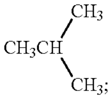

(b) an ester selected from the group consisting of dialkyl, trialkyl, and tetraalkyl having the general structure:

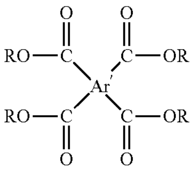

wherein R is:

H, $CH_3$, $CH_3CH_2$, $CH_3CH_2CH_2$, or 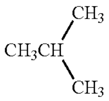

and wherein Ar' is a tetravalent aryl radical; and (c) an aromatic diamine;

a grading layer embedded inside the insulation layer; and an earth layer embedded in the insulation layer and around the grading layer, wherein the insulated electrical conductor maintains its electrical circuit and structural integrity at a temperature of at least about 1600° F. for at least three (3) hours.

* * * * *